(12) United States Patent
Kasahara

(10) Patent No.: US 8,642,484 B2
(45) Date of Patent: Feb. 4, 2014

(54) METHOD FOR MANUFACTURING SEMICONDUCTOR DEVICE

(75) Inventor: Yusuke Kasahara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 13/415,593

(22) Filed: Mar. 8, 2012

(65) Prior Publication Data

US 2013/0059437 A1    Mar. 7, 2013

(30) Foreign Application Priority Data

Sep. 7, 2011   (JP) .................................. 2011-94635

(51) Int. Cl.
*H01L 21/302*    (2006.01)
(52) U.S. Cl.
USPC ............ 438/738; 438/735; 438/736; 438/737
(58) Field of Classification Search
USPC .................................................. 438/735–738
See application file for complete search history.

(56) References Cited

U.S. PATENT DOCUMENTS

| 8,084,360 B2 | 12/2011 | Kasahara et al. |
| 2008/0206655 A1* | 8/2008 | Nozawa et al. ................... 430/5 |
| 2010/0233633 A1* | 9/2010 | Nguyen et al. ................ 430/323 |
| 2012/0061743 A1* | 3/2012 | Watanabe et al. ............. 257/324 |

FOREIGN PATENT DOCUMENTS

JP    2009-212280    9/2009

* cited by examiner

*Primary Examiner* — Bac Au
(74) *Attorney, Agent, or Firm* — Finnegan, Henderson, Farabow, Garrett & Dunner, L.L.P.

(57) ABSTRACT

According to one embodiment, a method for manufacturing a semiconductor device includes forming a film containing boron on a semiconductor substrate, forming a film containing silicon oxide on the film containing boron, patterning the film containing silicon oxide and etching the film containing boron with a gas containing chlorine by using the patterned film containing silicon oxide as a mask.

20 Claims, 4 Drawing Sheets

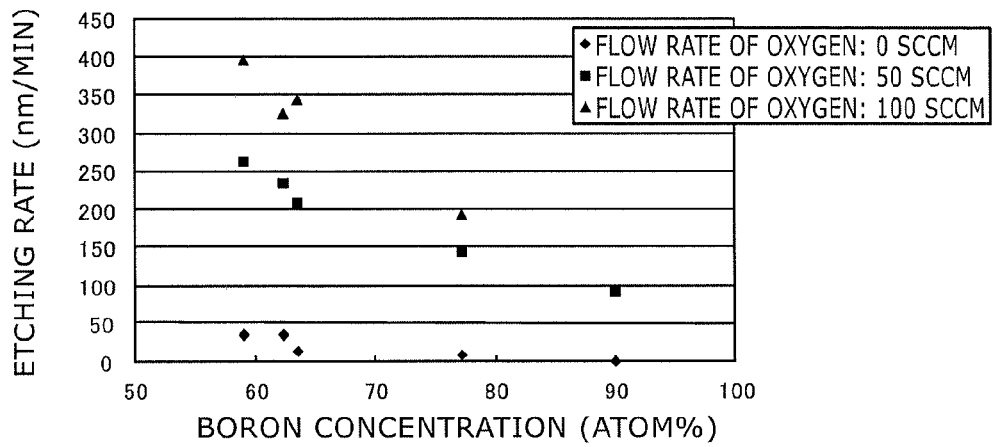
FIG. 5A  ETCHING GAS : C₄F₈ GAS
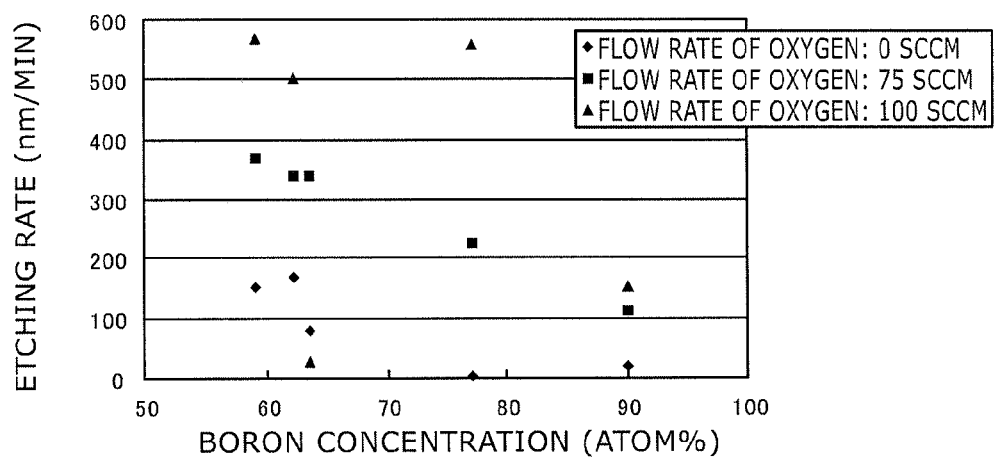
FIG. 5B  ETCHING GAS : CF₄ GAS
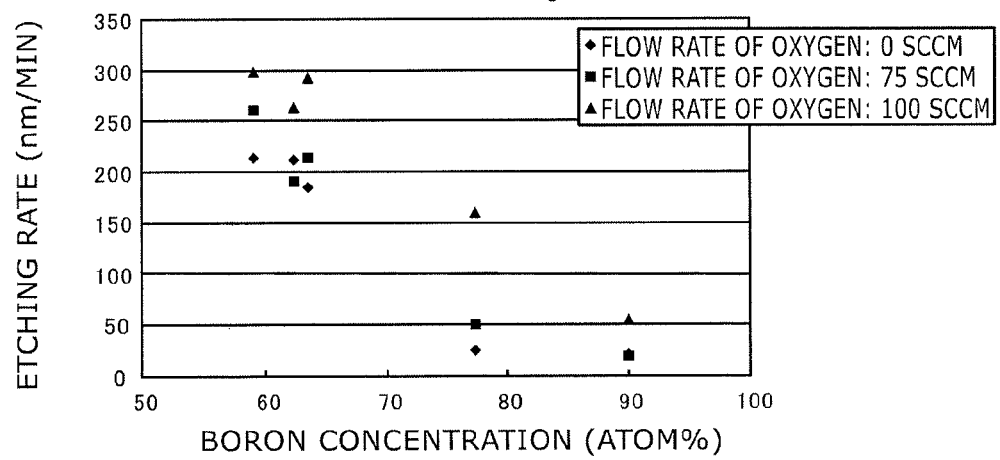
FIG. 5C  ETCHING GAS : CHF₃ GAS

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2011-194635, filed on Sep. 7, 2011; the entire contents of which are incorporated herein by reference.

FIELD

Embodiments described herein relate generally to a method for manufacturing a semiconductor device.

BACKGROUND

For a purpose of reducing manufacturing processes of a highly integrated semiconductor device, collective processing of a stacked film is required in which a plurality of films made of an insulating material and a plurality of films made of an electrically conductive material are stacked alternately.

During this processing, the selectivity of etching for the conductive films of the stacked film can be ensured by using a mask made of silicon oxide ($SiO_2$). However, the selectivity of etching for the insulating films of the stacked film is difficult to be ensured.

One countermeasure against the problem is to increase the thickness of the mask made of silicon oxide. However, if the thickness of the mask is made larger, processing of the mask becomes more difficult, and the processing time becomes longer.

Furthermore, if a mask made of metal is used, etching may be inhibited by reaction products during etching. Moreover, metallic contamination may occur.

BRIEF DESCRIPTION OF THE DRAWINGS

FIGS. 5A to 5C are graph charts illustrating relationships between a boron concentration contained in boron films and an etching rate, in which the horizontal axis represents the boron concentration and the vertical axis represents the etching rate, FIG. 5A shows a case in which a $C_4F_8$ gas is used for a etching gas, FIG. 5B shows a case in which a $CF_4$ gas is used for the etching gas, and FIG. 5C shows a case in which a $CHF_3$ gas is used for the etching gas;

DETAILED DESCRIPTION

In general, according to one embodiment, a method for manufacturing a semiconductor device includes forming a film containing boron on a semiconductor substrate, forming a film containing silicon oxide on the film containing boron, patterning the film containing silicon oxide and etching the film containing boron with a gas containing chlorine by using the patterned film containing silicon oxide as a mask.

Embodiment

An embodiment will now be described with reference to drawings.

FIGS. 1 to 4 are process cross-sectional views illustrating the method for manufacturing a semiconductor device according to the embodiment.

FIGS. 5A to 5C are graph charts illustrating relationships between a boron concentration contained in boron films and an etching rate, in which the horizontal axis represents the boron concentration and the vertical axis represents the etching rate. FIG. 5A shows a case in which a $C_4F_8$ gas is used for a etching gas, FIG. 5B shows a case in which a $CF_4$ gas is used for the etching gas, and FIG. 5C shows a case in which a $CHF_3$ gas is used for the etching gas.

Figure 6:
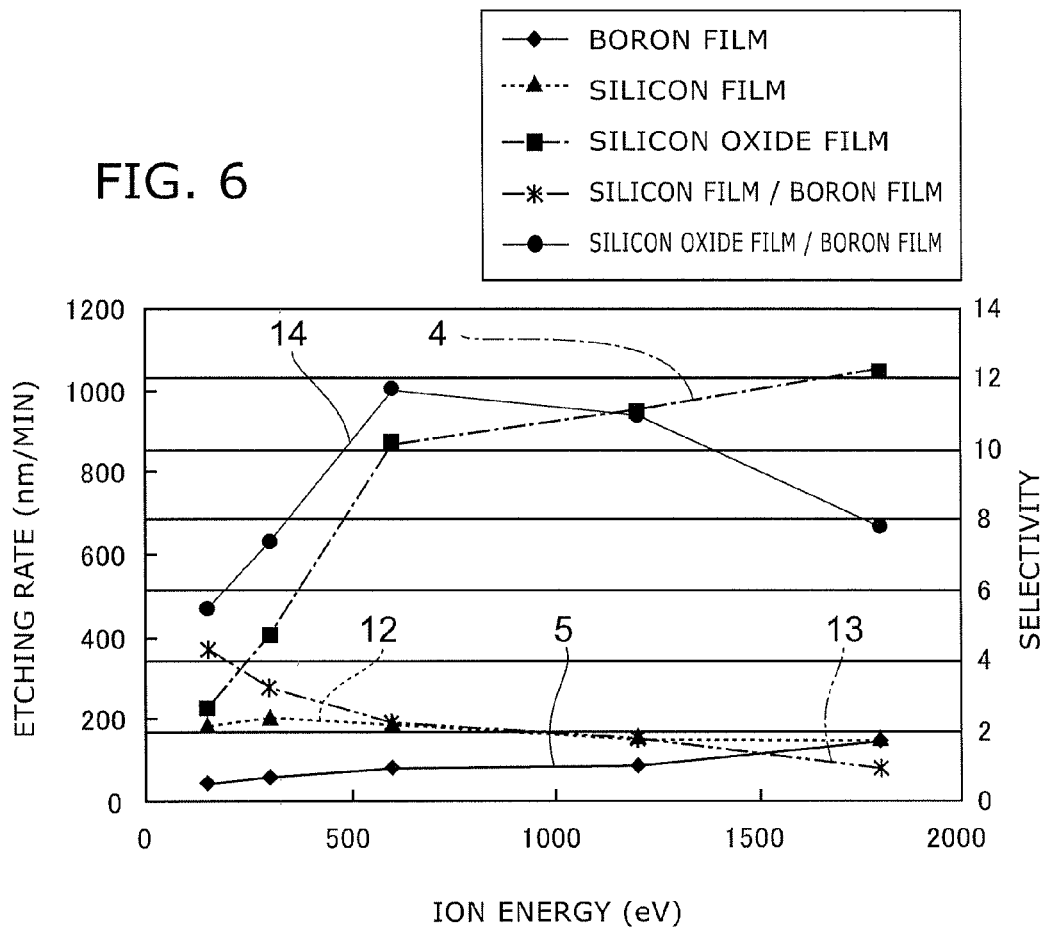
FIG. 6 is a graph chart illustrating a relationship among an ion energy, an etching rate and a etching selectivity according to the embodiment, in which the horizontal axis represents the ion energy for reactive ion etching, the left vertical axis represents the etching rate, and the right vertical axis represents the etching selectivity.

FIG. 6 is a graph chart illustrating a relationship among an ion energy, an etching rate and a etching selectivity according to the embodiment, in which the horizontal axis represents the ion energy for reactive ion etching, the left vertical axis represents the etching rate, and the right vertical axis represents the etching selectivity.

Figure 1:
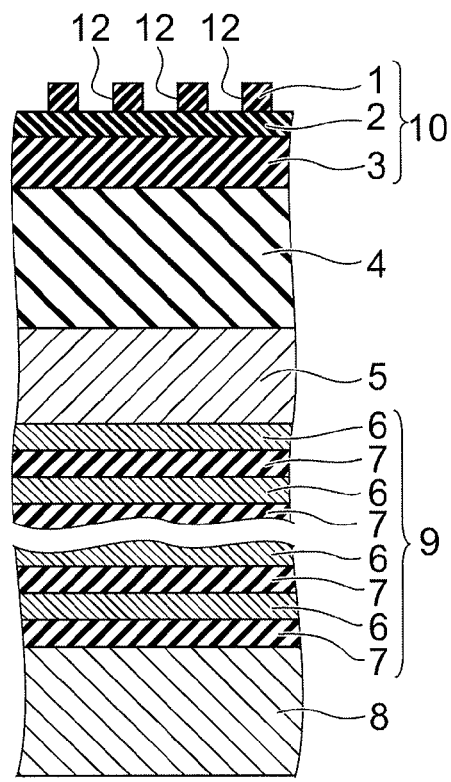
FIG. 1 is a process cross-sectional view illustrating a method for manufacturing a semiconductor device according to an embodiment.

As shown in FIG. 1, first, an insulating film 7 is formed on a semiconductor substrate 8, for example, a silicon substrate. After that, a conductive film 6 is formed on the insulating film 7. Furthermore, an insulating film 7 is formed on the conductive film 6, and a conductive film 6 is formed on the insulating film 7. Subsequently, in a similar way, insulating films 7 and conductive films 6 are alternately formed. In this way, a stacked film 9 is formed, in which multiple of insulating films 7 and multiple of conductive films 6 are stacked alternately.

The conductive film 6 is, for example, a polysilicon film to which boron has been added. The polysilicon film to which boron has been added is formed at a thickness of 50 nm by, for example, a plasma CVD (chemical vapor deposition) method.

The insulating films 7 is, for example, a silicon oxide film. The silicon oxide film is formed at a thickness of 35 nm by a plasma CVD method using, for example, TEOS (tetra ethyl ortho silicate).

The stacked film 9 is formed by stacking the conductive film 6 and the insulating film 7 alternately by not less than 5 layers, for example, 24 layers.

Next, a boron film 5 is formed on the stacked film 9. The boron film 5 is formed at a thickness not less than 300 nm, for example, 700 nm, by an LPCVD (low pressure chemical vapor deposition) method. In the boron film 5, boron is contained at a concentration not less than 90 atom %.

Then, a silicon oxide film 4 is formed on the boron film 5. The silicon oxide film 4 is formed at a thickness not less than 300 nm, for example, 500 nm, by a plasma CVD method using TEOS.

After that, a lower layer resist film 3 is formed on the silicon oxide film 4. The lower layer resist film 3 is formed by applying a resist material on the silicon oxide film 4 by a spin coating method. The lower layer resist film 3 is formed at a thickness of 300 nm.

An SOG (Spin on Glass) film 2 is formed on the lower layer resist film 3. The SOG film 2 is formed by applying silicon oxide dissolved in a solvent on the lower layer resist film 3 by a spin coating method, then, by heat treatment of the coated film 9. The SOG film 2 is formed at a thickness of 110 nm.

An upper layer resist film 1 is formed on the SOG film 2. The upper layer resist film 1 is formed by applying a resist material on the SOG film 2 by a spin coating method.

A SMAP (Stacked Mask Process) film 10 is constituted by the upper layer resist film 1, the SOG film 2, and the lower layer resist film 3.

Next, a hole pattern is formed in the upper layer resist film 1 by forming a plurality of holes 12 in the upper layer resist film 1 by means of a lithography method. The diameter of the holes 12 is set to, for example, 70 nm.

Then, the SOG film 2 is etched by using the upper layer resist film 1, in which the hole pattern has been formed, as a mask. Because of this, the hole pattern, in which the holes 12 have been formed, is transferred to the SOG film 2.

Next, the lower layer resist film 3 is etched by using the SOG film 2, in which the hole pattern has been formed, as a mask. Because of this, the hole pattern, in which the holes 12 have been formed, is transferred to the lower layer resist film 3.

Furthermore, the silicon oxide film 4 is etched by using the lower layer resist film 3, in which the hole pattern has been formed, as a mask. Because of this, the hole pattern, in which the holes 12 have been formed, is transferred to the silicon oxide film 4.

Then, the lower layer resist film 3 is peeled off by ashing.

Figure 2:
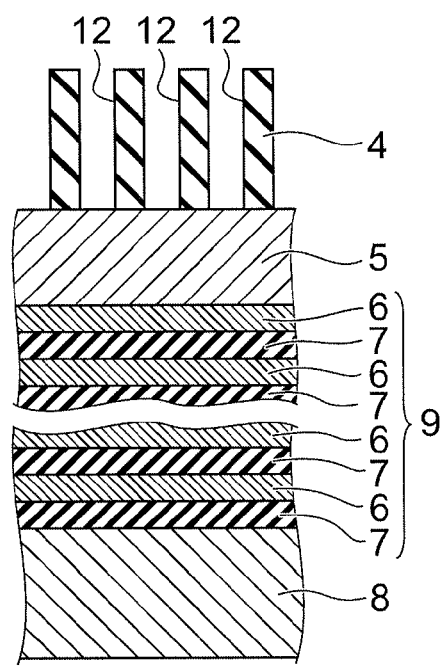
FIG. 2 is the process cross-sectional view illustrating the method for manufacturing the semiconductor device according to the embodiment.

Because of this, as shown in FIG. 2, a mask made of the silicon oxide film 4, in which the hole pattern including holes 12 has been formed, can be obtained.

Next, the boron film 5 is etched by using the silicon oxide film 4 as a mask.

Etching conditions when etching the boron film 5 will now be described.

Etching is carried out by a RIE (reactive ion etching) method. A gas containing a chlorine ($Cl_2$) gas is used as an etching gas. A single chlorine gas may be used as the etching gas.

The etching is carried out by using a RIE apparatus, in which a frequency of electromagnetic waves applied in a chamber is a superposition of two frequencies of 100 MHz and 13.56 MHz. The pressure in the apparatus is set to be, for example, 30 mTorr (mT), and the power of high frequency waves of 100 MHz applied between an object to be etched and the apparatus is set to be 1300 W. The power of high frequency waves to be applied of 13.56 MHz is set to be not less than 1000 W, preferably, 3000 W.

Figure 3:
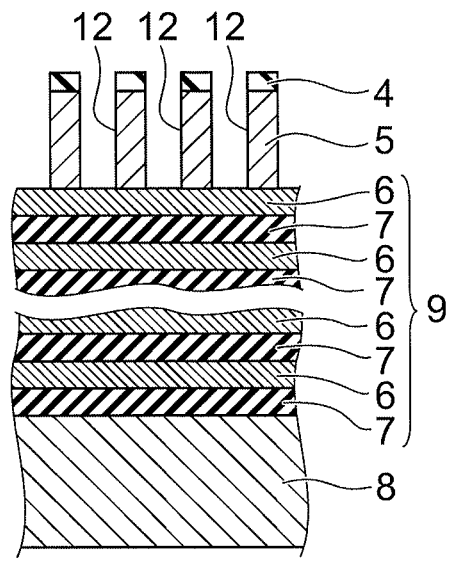
FIG. 3 is the process cross-sectional view illustrating the method for manufacturing the semiconductor device according to the embodiment.

In this way, as shown in FIG. 3, the hole pattern including holes 12 is formed in the boron film 5. The diameter of the formed hole 12 is 70 nm. The thickness of the boron film 5, in which the holes 12 have been formed, is larger than the diameter of the holes 12. Therefore, the shape of the holes 12 has a high aspect ratio.

Even if the silicon oxide film 4 used as a mask at the time of finishing etching the boron film 5 remains on the boron film 5, peeling off the film 4 is not necessary. The silicon oxide film 4 remaining can also be used as a mask when the stacked film 9 is etched.

Next, the stacked film 9 is etched by using the boron film 5 as a mask.

Etching conditions when etching the stacked film 5 will now be described.

The etching is carried out by a RIE method. A tetrafluoromethane ($CF_4$) gas is used as an etching gas. Although a single gas of tetrafluoromethane is used as the etching gas, hydrogen bromide (HBr) may be added in tetrafluoromethane. Addition amount of hydrogen bromide relative to the tetrafluoromethane gas is desirable to be not more than 1/10 in terms of a flow rate ratio.

The etching is carried out using a RIE apparatus in which a frequency of electromagnetic waves is a superposition of two frequencies of 100 MHz and 13.56 MHz. The pressure in the apparatus is set to be 30 mTorr (mT), and the power of high frequency waves of 100 MHz applied between an object to be etched and the apparatus is set to be 1000 W. The power of high frequency waves to be applied of 13.56 MHz is set to be 200 W.

Figure 4:
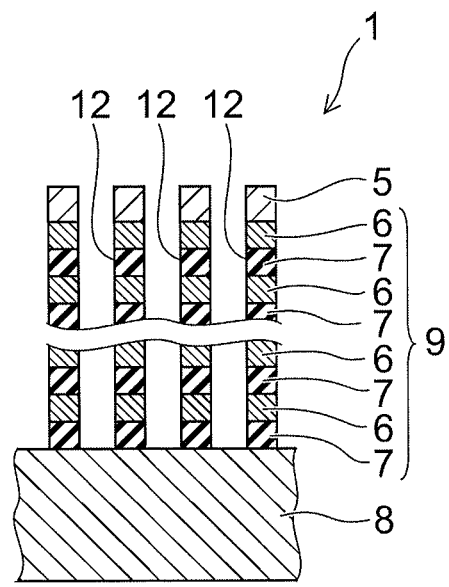
FIG. 4 is the process cross-sectional view illustrating the method for manufacturing the semiconductor device according to the embodiment.

In this way, as shown in FIG. 4, the hole pattern including holes 12 is formed in the stacked film 9. The thickness of the stacked film 9 in which the holes 12 have been formed is larger than diameter of the holes 12. Therefore, the shape of the holes 12 has a high aspect ratio.

After forming the holes 12 in the stacked film 9, the boron film 5 is removed. The boron film 5 can be removed by, for example, wet etching or a CMP (chemical mechanical polishing) method.

Next, a silicon oxide film is formed on a side face of the hole of the stacked film 9. After that, a silicon nitride film is formed on the silicon oxide film. Then, a silicon oxide film is formed on the silicon nitride film. Because of this, a so-called ONO (oxide-nitride-oxide) film (not shown) is formed on a side face of the stacked film 9. Furthermore, a silicon oxide film is formed on the ONO film. In this way, a memory cell is formed on an intersection of a pillar made from a silicon film and the conductive film 6.

Effects of the embodiment will now be described.

According to a method for manufacturing a semiconductor device 1 of the embodiment, since a gas containing chlorine is used as an etching gas when etching the boron film 5 by using the silicon oxide film 4 as a mask, the generation of sediments at the time of the etching can be suppressed. It is desirable that a rate of chlorine contained in the etching gas is as high as possible, and it is further desirable for the gas to be a single chlorine gas. Containing chlorine in the etching gas makes it harder to fill sediments inside the holes 12, thereby preventing the etching from being stopped in the middle. Furthermore, the deposition of sediments on a side face of a lower part of the holes 12 is hard to take place, thereby preventing the holes 12 from taking the form of a tapered shape. Therefore, a high aspect ratio hole pattern can be formed, with a sufficient yield, in the boron film 5.

Moreover, when etching the boron film 5, the silicon oxide film 4 is used as a mask. Since, like the boron film 5, the silicon oxide film 4 can also be used as a mask when etching the stacked film 9, even if the silicon oxide film 4 remains on the boron film 5 at the time of finishing etching the stacked film 9, peeling off the silicon oxide film 4 purposely is not necessary. Therefore, manufacturing processes can be reduced. Because of this, a production cost can be reduced.

Furthermore, when etching the stacked film 9, a tetrafluoromethane gas is used as an etching gas. Because of this, both of the conduction films 6 and the insulating films 7 constituting the stacked film 9, can be etched collectively. Moreover, when etching the stacked film 9, the boron film 5 is used as an etching mask. Because of this, both of the conduction films 6 and the insulating films 7 constituting the stacked film 9, can be etched collectively, with a selectivity. Therefore, thickness of the mask can be reduced in comparison with the case where silicon oxide film is used as a mask, thereby, enabling the reduction of manufacturing processes.

As shown in FIG. 5, even if any of perfluorocyclobutane ($C_4F_8$), tetrafluoromethane, and trifluoromethane ($CHF_3$) is used as an etching gas when etching the stacked film 9, the etching rate of the boron film 5 becomes smaller as the concentration of boron contained in the boron film 5 is larger. This indicates that as the concentration of boron contained in the boron film 5 is larger, the boron film 5 is more suitable for a material of an etching mask. Accordingly, the higher concentration of boron contained in the boron film 5 is preferable, and especially, when the concentration is not less than 90 atom %, the etching rate is preferable as the material of the mask. Rhomboids, tetragons, and triangles in drawings indicate flow rates of oxygen contained in the etching gas.

As shown in FIG. 6, when power of a high frequency wave in reactive ion etching is represented as an ion energy, etching rate of the silicon film 12 seldom changes within a range of 200 eV to 1800 eV.

Although the etching rate of the silicon oxide film 4 becomes larger as the ion energy becomes larger, the gradient in a range of 600 eV to 1800 eV is larger than the gradient in a range of 200 eV to 500 eV. The etching rate of the boron film 5 also becomes larger as the ion energy becomes larger. Because of this, the etching selectivity 13 of the silicon film 12 relative to the boron film 5 becomes smaller as the ion energy becomes larger.

In contrast, for the etching selectivity 14 of the silicon oxide film 4 relative to the boron film 5, although the gradient in the ion energy of 200 eV to 600 eV is positive, the gradient in the ion energy of 600 eV to 1800 eV is negative. This is due to the change of the etching rate of the silicon oxide film 4 near 600 eV. However, selectivity 14 is shown to be not less than 4 in the range of 200 eV to 1800 eV.

Therefore, in order to increase the etching selectivity of the stacked film 9 relative to the boron film 5, the etching selectivity 13 of the silicon film 12 relative to the boron film 5 should be increased. Accordingly, it is desirable that the ion energy is not more than 1000 eV. Furthermore, if the ion energy is not more than 500 eV, it is possible to secure selectivity of 2 to any of the silicon film 12 and the silicon oxide film 4. Moreover, if the ion energy is 200 eV, it is possible to secure selectivity of 4 to any of them.

At the time of etching the stacked film 9, when the ion energy is not more than 1000 eV, especially, not more than 500 eV, amount of the boron film 5 shaved by sputtering is reduced, and thus the amount of etching a so-called shoulder part of a connection part between a top face of the boron film 5 and a side face of the holes 12, can be reduced. Therefore, the shape of the holes 12 can be formed with sufficient accuracy.

Deposition increases by adding hydrogen bromide to a tetrafluoromethane gas as an etching gas. Because of this, enlarging and bowing of the diameter of the holes 12 can be suppressed. It is desirable to make the flow rate of hydrogen bromide relative to the flow rate of the tetrafluoromethane gas not more than 1/10. If hydrogen bromide is added at a flow rate not less than 1/10 relative to the flow rate of the tetrafluoromethane gas, the deposition increases to fill the holes 12, thereby, disabling etching.

In the embodiment, although an etching mask having a hole pattern shape including the holes 12 has been used, an etching mask having a pattern shape including grooves instead of the holes 12 may be used.

In the embodiment, although a polysilicon film and a silicon oxide film are used as the conductive film 6 and the insulating film 7, constituting a stacked layer 9, they are not limited to this. For example, a metal film and a silicide metal oxide film may be used as the conductive film 6, and a silicon nitride film and a metal oxide film may be used as the insulating film.

Furthermore, different materials may be used for each of layers of the conductive layers 6 and the insulating layers 7, constituting a stacked layer.

Comparative Example

A comparative example of the embodiment will now be described.

Figure 7:
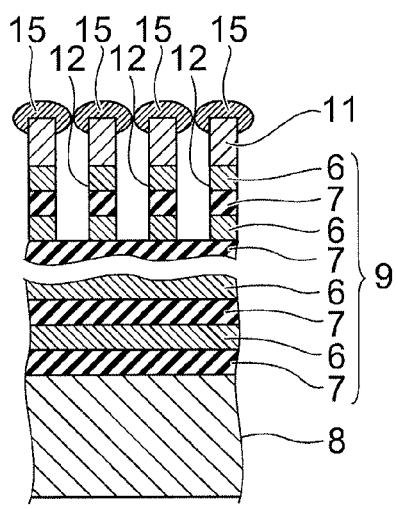
FIG. 7 is a process cross-sectional view illustrating a method for manufacturing a semiconductor device according to the comparative example of the embodiment.

FIG. 7 is a process cross-sectional view illustrating a method for manufacturing a semiconductor device according to the comparative example of the embodiment.

In the comparative example, a carbon film 11 is used instead of the boron film 5.

As shown in FIG. 7, the carbon film 11 is formed on a stacked film 9 by a CVD method. After that, an LTO film (low temperature silicon oxide film) is formed on the carbon film 11 by a CVD method. Then, a resist film is formed by applying a resist material on the LTO film. After that, the resist film is patterned. Because of this, the resist film is constituted in the same way as the SMAP film 10 of the above-described embodiment. By the same way as the processing the SMAP film 10, the carbon film 11 is etched by using a patterned silicon oxide film 4 as a mask. Then, the stacked film 9 is etched by using the patterned carbon film 11 as a mask.

According to the method for manufacturing a semiconductor device, the carbon film 11 can also secure a selectivity with respect to the electric conduction film 6 and the insulating film 7. However, if the carbon film 11 is used as a mask, carbon is also etched and supplied into plasma, at the time of etching the stacked film 9. For this reason, a radical containing carbon is generated and a material-to-be-deposited 15 is deposited also on a wafer. Since the radical containing carbon has a high sticking probability, it deposits on frontage of the holes 12, thereby resulting in closing the holes 12. Accordingly, yields in the manufacturing of the semiconductor device are degraded.

In order to prevent it, the inclusion of oxygen into an etching gas and the oxidation of carbon fine particles for removal can be considered, but this increases etching rate of the carbon film, thereby resulting in being incapable of securing the etching selectivity.

According to the embodiment described above, a method for manufacturing a semiconductor device capable of achieving cost reduction can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device comprising:

forming a film containing boron on a semiconductor substrate;

forming a film containing silicon oxide on the film containing boron;

patterning the film containing silicon oxide; and etching the film containing boron with a gas containing chlorine by using the patterned film containing silicon oxide as a mask.

2. The method according to claim 1, wherein in forming the film containing boron, the film containing boron is used as a film containing boron at a concentration not less than 90 atom %.

3. The method according to claim 1, wherein in forming the film containing boron, a thickness of the film containing boron is made not less than 300 nm.

4. The method according to claim 1, wherein in etching, the gas containing chlorine is used as a single chlorine gas.

5. The method according to claim 1, wherein in etching, a hole is formed in the film containing boron by etching.

6. The method according to claim 5, wherein a thickness of the film containing boron is made larger than a diameter of the hole formed in the film containing boron.

7. The method according to claim 1, wherein in etching, etching is carried out by RIE.

8. The method according to claim 1 further comprising:

forming a stacked film in which conductive films containing silicon and insulating films containing silicon oxide are stacked alternately; and etching the stacked film using the etched film containing boron as a mask; wherein the film containing boron is formed on the stacked film.

9. The method according to claim 8, wherein in forming the stacked film, the conductive film containing silicon is used as a polysilicon film to which boron has been added, and the insulating film containing silicon oxide is used as a film formed by using TEOS.

10. The method according to claim 8, wherein in forming the stacked film, the conductive film containing silicon and the insulating film containing silicon oxide are stacked alternately by not less than 5 layers.

11. The method according to claim 8, wherein in etching the stacked film, etching is carried out by RIE.

12. The method according to claim 8, wherein in etching the stacked film, the film containing silicon oxide is caused to remain on the film containing boron.

13. The method according to claim 8, wherein in etching the stacked film, a hole is formed in the stacked film.

14. The method according to claim 13, wherein a thickness of the stacked film is made larger than a diameter of the hole formed in the stacked film.

15. The method according to claim 13, further comprising forming an ONO film on a side face of the hole.

16. The method according to claim 15, further comprising forming a pillar made of a silicon film on the ONO film.

17. The method according to claim 8, wherein in etching the stacked film, a gas containing tetrafluoromethane is used.

18. The method according to claim 17, wherein in etching the stacked film, hydrogen bromide is contained in the gas containing tetrafluoromethane.

19. The method according to claim 18, wherein addition amount of the hydrogen bromide relative to the tetrafluoromethane is made not more than 1/10 in terms of a flow rate ratio.

20. The method according to claim 8, wherein in etching the stacked film, etching is carried out by making ion energy not more than 1000 eV.

* * * * *